United States Patent [19]

Brown

[11] Patent Number: 5,033,627
[45] Date of Patent: Jul. 23, 1991

[54] EQUIPMENT SHELF

[75] Inventor: David C. Brown, Belleville, Canada

[73] Assignee: Northern Telecom Limited, Montreal, Canada

[21] Appl. No.: 497,167

[22] Filed: Mar. 22, 1990

[51] Int. Cl.$^5$ .............................................. A47B 63/00
[52] U.S. Cl. ........................................ 211/41; 211/26
[58] Field of Search ................ 211/41, 26; 361/415, 361/399

[56] References Cited

U.S. PATENT DOCUMENTS

| | | | |
|---|---|---|---|
| 2,986,281 | 5/1961 | Jordan | 211/41 |
| 3,696,936 | 10/1972 | Straccia et al. | 211/41 |
| 4,323,161 | 4/1982 | Marconi | 211/41 |
| 4,324,330 | 4/1982 | Durney | 211/41 X |
| 4,335,819 | 6/1982 | Weisman et al. | 361/415 |
| 4,607,751 | 8/1986 | Straccia, Sr. et al. | 211/41 |
| 4,787,081 | 11/1988 | Waters et al. | 370/85 |

OTHER PUBLICATIONS

Catalogue—BICC-VERO Electronics Inc., "Cardframe and Accessories Catalogue", 40 Lindeman Drive, Trumbull, Conn. 06611, U.S.A., (Mar. 1985).
Catalogue—EG&G Birtcher Industrial Products, P.O. Box 5268-91734, 4505 North Arden Drive, El Monte, Calif. 91731, U.S.A., (undated).

Primary Examiner—Alvin C. Chin-Shue
Assistant Examiner—Sarah A. Lechok
Attorney, Agent, or Firm—J. E. Moorhouse

[57] ABSTRACT

An equipment shelf includes circuit board slides being arranged to support edges of circuit boards, whereby the circuit boards are removably retained in a system. First and second end panels are fixed in a spaced apart relationship by a pair of front cross connecting members and by a pair of rear cross connecting members. Each of the circuit board slides is carried between an inner edge of a front cross connecting member and an inner side of a rear cross connecting member. As each board slide is overlapped by only one of the cross connecting members, the cross connecting members are more widely spaced from front to back than would otherwise be the case, whereby greater area for a flow of a ventilating medium is available.

11 Claims, 6 Drawing Sheets

EQUIPMENT SHELF

FIELD OF THE INVENTION

The invention is in the field of electronic systems and is concerned with an equipment shelf for retaining circuit boards in an electronic system.

BACKGROUND OF THE INVENTION

Over the last decade or so, some electronic systems such as telephone switching facilities or main frame computers and the like have demonstrated a convergence of technologies. Likewise, these apparatuses have taken on a general sameness of physical appearance, particularly in the retainment of circuit board elements. Each of the systems of interest is characterized by an equipment shelf having circuit board slides being arranged in parallel one with another, in a row, for receiving edge surfaces of a plurality of circuit boards. A circuit board is inserted from a front side of the equipment shelf into a pair of the circuit board slides where the circuit board is retained, and it is electrically and/or optically connected into the system by conductors carried by a back plane at a back side of the equipment shelf. One example of this structure is found in U.S. Pat. No. 4,787,081, issued on Nov. 22, 1988 and entitled "TIME DIVISION MULTIPLEX EQUIPMENT SHELVES", which at a glance, may appear to be similar, but have remained distinct because of design variations in circuit board dimensions which of course dictate like differences in slide spacing and depth. Such distinct variations are not limited between systems but may also exist within a system of any one type. One reason for variation is that some circuit boards generate more heat than others, while in operation. It is desirable to arrange circuit boards, in an equipment shelf, with a minimum of space therebetween in order to maximize the use of space in any given system. However the minimum spacing attainable between circuit boards can be dictated by several factors, one of which is providing for adequate ventilation to allow for dissipation of heat generated by normal operation of the circuit boards.

My application for patent, entitled "EQUIPMENT SHELF", was filed in Canada on Sept. 29, 1989, and is identified with Ser. No. 614,700. My application teaches that the expense of inventory associated with the variety and number of piece parts typically required for the manufacture of various equipment shelves used in some electronic systems may be reduced.

In one example, the equipment shelf includes a plurality of circuit board slides, each having an elongated body with a groove in one side thereof, for receiving an edge of a circuit board, and a plurality of attachment projections extending from another side thereof. The circuit board slides are grouped in pairs, each for slidably engaging opposite edges of a circuit board. First and second side panels are spaced apart by a plurality of elongated cross connecting members, which receive the attachment projections in retaining means facing the circuit board locations. One of the advantages of this equipment shelf is that each of the elongated spacing members is provided by an extrusion which is cut to length for assembly. In assembly, each of the elongated spacing members is orientated to fit at its location where it is secured in place by screw threaded fasteners. Each extrusion is shaped to receive retaining means in the form of a thin flat strip with holes formed therein at predefined locations, for fastening the board slides.

However, this assembly is at some disadvantage, as each spacing member is a little wider than it would otherwise be, in order to facilitate the feature of adaptability. This greater width has been observed to have an adverse effect upon otherwise satisfactory ventilation characteristics of the equipment shelf. Air flow required for cooling during operation is somewhat restricted by the width of each of the cross connecting members. This width is convenient for providing the adaptability of the equipment shelf and may be compensated for by positioning the circuit boards at greater than typical spacing, to obtain adequate ventilation. However, increased spacing of the circuit boards may also increase the amount of floor space required to accommodate the electronic system.

It is an object of the present invention to improve ventilation of circuit boards retained in an adaptable equipment shelf.

SUMMARY OF THE INVENTION

An equipment shelf in accordance with the invention includes circuit board slides being arranged to support edges of circuit boards, whereby the circuit boards are removably retained in a system. The equipment shelf comprises: first and second end panels being fixed in a spaced apart relationship by a pair of front cross connecting members and by a pair of rear cross connecting members, and each of the circuit board slides being carried between an inner edge of a front cross connecting member and an inner side of a rear cross connecting member.

As each board slide is overlapped by only one of a front and a rear cross connecting member, the cross connecting members are more widely spaced from front to back than would otherwise be the case.

In one example of the invention, the equipment shelf comprises:
  first and second end panels having front and rear edges being fixed in a spaced apart relationship by a pair of front cross connecting members and by a pair of rear cross connecting members, respectively;
  a plurality of circuit board slides being carried between an inner edge of a front cross connecting member and an inner side of a rear cross connecting member, each of the circuit board slides comprising:
  an elongated body including a pair of side walls connected by first and second edge walls, the side and edge walls extending a length between first and second fastening formations, the first fastening formation being fixed to the inner edge, and the second fastening formation being fixed to the inner side;
  a groove in the first edge wall and being defined by parallel sidewalls connected by a floor, the groove being for receiving the edge of one of the circuit boards;
  the first fastening formation including a projection extending substantially parallel with respect to a line along said floor;
  the second fastening formation including a projection extending substantially normal with respect to said line; and
  each of the front cross connecting members comprises:

a fastening element being an elongated flat strip having fastening locations being defined therein spaced apart one from another;

a retaining means wherein the fastening element is realisably fixed, the retaining means being a retaining channel extending between the end portions, along the interior edge of the body, and the retaining channel being defined by a pair of side surfaces being connected by a third surface, each of the pair of side surfaces having a groove therein being spaced a first predetermined distance from the third surface, the elongated flat strip is retained therein, the retaining channel including a pair of walls extending from the side surfaces toward one another and terminating at secondary side walls being spaced a predetermined distance apart one from another; and the first fastening formation including a rectangular protrudence being of a dimension to fit between the secondary side walls to restrain the circuit board slide from rotational movement.

BRIEF DESCRIPTION OF THE DRAWINGS

An example of an equipment shelf is discussed with reference to the accompanying drawings, in which.

DESCRIPTION OF THE PREFERRED EMBODIMENTS

Figure 1:
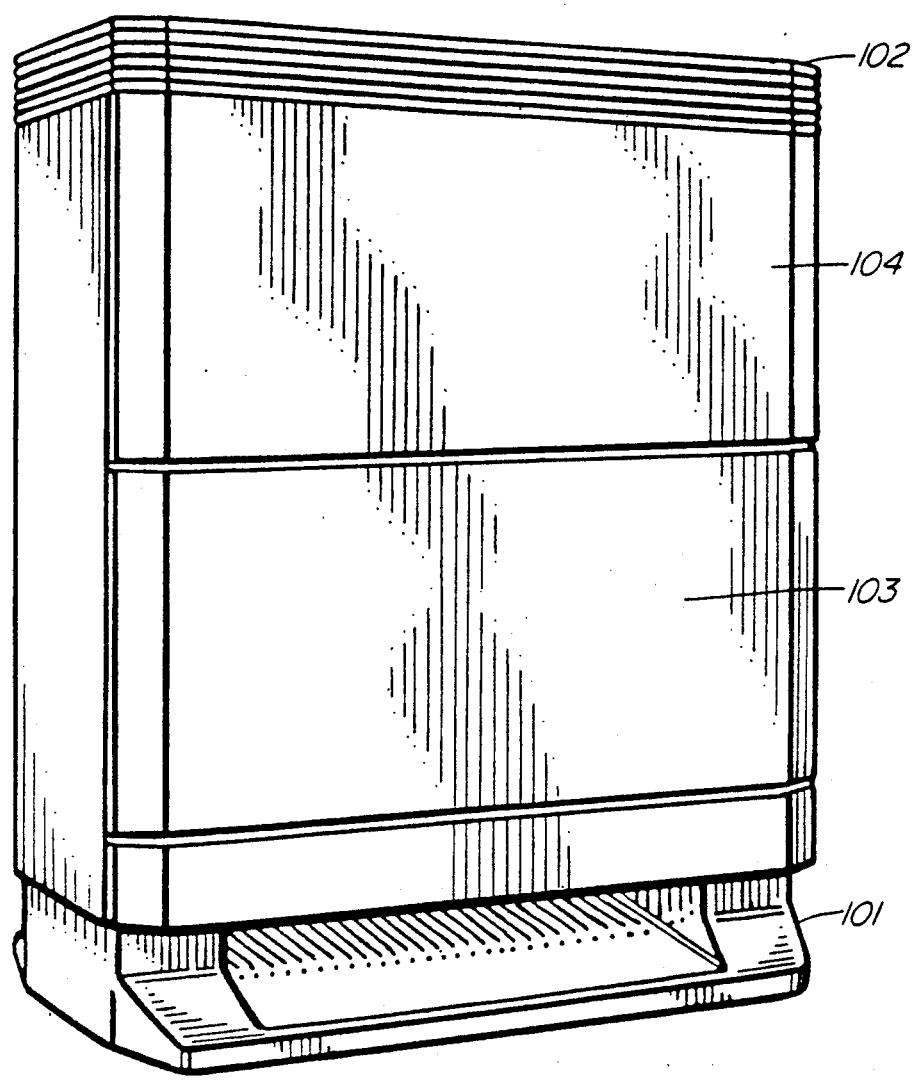
FIG. 1 is a perspective view of an equipment cabinet suitable for housing a telecommunications switching system.
Figure 2:
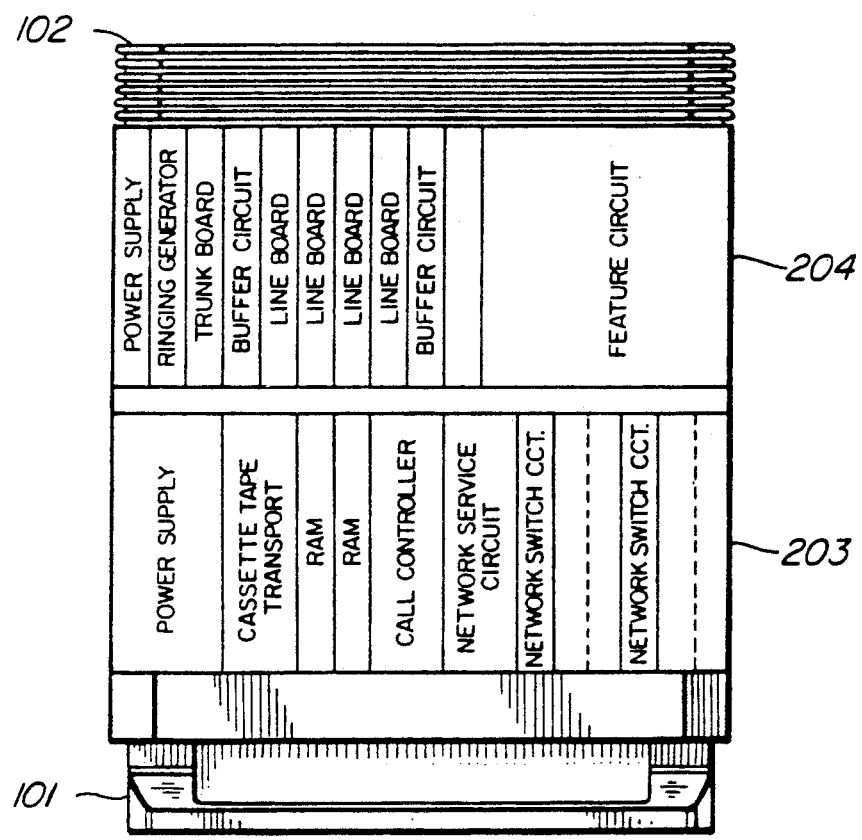
FIG. 2 is a block schematic diagram illustrating one of many possible examples of typical physical circuit locations within upper and lower equipment shelves in the equipment cabinet illustrated in FIG. 1.

Referring to FIG. 1, the equipment cabinet includes a pedestal 101 which carries lower and upper equipment shelves underneath a louvred cap 102. The lower and upper equipment shelves are hidden behind lower and upper covers 103 and 104. The system illustrated in FIG. 2 shows the lower and upper equipment shelves 203 and 204 being occupied by a combination of circuit units of various lateral dimensions for performing various functions, as labelled, to provide an operating system in accordance with a particular specification.

Figure 3:
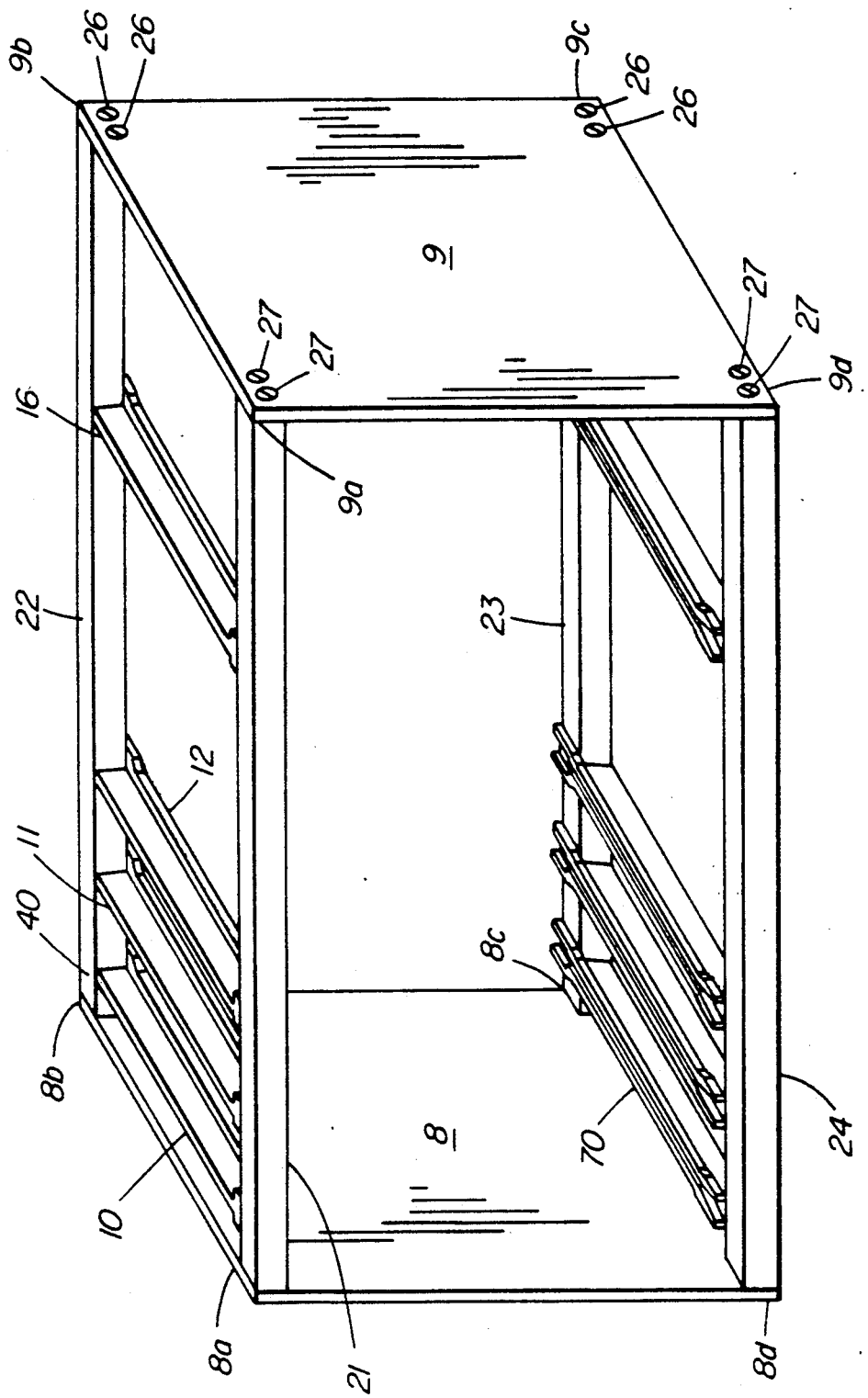
FIG. 3 is a simplified perspective view of an equipment shelf, in accordance with the invention, suitable for use in the system illustrated in FIGS. 1 and 2.

An example of an equipment shelf for holding circuit board slides 70, in accordance with the invention, is that illustrated in FIG. 3. This equipment shelf includes first and second side panels 8 and 9 being fixed apart one from the other by front cross connecting members 21 and 24, and by rear cross connecting members 22 and 23. The front cross connecting members 21 and 24 are cut to length from a standardized front extrusion body, of cross section as illustrated in FIG. 4b, and thereafter fastened by metal screws 27 between respective corners 8a-9a and 8d-9d of the side panels 8 and 9. The rear cross connecting members 22 and 23 are cut to length from a standardized rear extrusion body, of cross section as illustrated in FIG. 5b, and thereafter fastened by metal screws 26 between respective corners 8b-9b and 8c-9c of the side panels 8 and 9. As shown in FIG. 4c, each front cross connecting member carries an elongated thin flat fastening strip 60 adjacent its inner edge, and as shown in FIG. 5c, each rear cross connecting member carries an elongated thin flat fastening strip 60 adjacent its inner side. Each of the fastening strips 60 includes holes 61 as exemplified in FIG. 6 for retaining slippery plastic circuit board slides as illustrated in FIGS. 7a-7e.

The circuit board slides 70 are retained by the holes 61 at circuit board slide locations 10, 11, 12 and 16, as exemplified in FIG. 3. Top side and bottom views of one of the circuit board slides are shown in the FIGS. 7a, 7b and 7c respectively. FIG. 7d is a view of the right hand end of the circuit board slide in FIG. 7a. FIG. 7e is a view of the left hand end of the circuit board slide in FIG. 7a. FIG. 7f is a view of a cross section of the circuit board slide in FIG. 7a, taken along a line 7f—7f. Each of the circuit board slides 70 includes an elongated body portion being defined by a pair of side walls 71 connected by first and second edge walls 72 and 73, the first edge wall 72 being broader than the second edge wall 73. The side and edge walls 71-73 extend between front and rear fastening formations at 80 and 90. Part of the side walls 71, along with the edge wall 73 define a reinforcing rib 77 which terminates with an edge 78 next to the rear fastening formation at 80, and abuts at 79 with the front fastening formation at 90. The reinforcing rib 77 underlies a groove 74, in the first edge wall 72, the groove 74 being defined by parallel sidewalls 75 connected by a floor 76. The front and rear fastening formations at 80 and 90 are intended for engagement adjacent the inner edge and the inner side of front and rear ones of the cross connecting members respectively. The front fastening formation at 80 includes a receiving end 84 and is provided where the parallel sidewalls 75 meet with divergent sidewalls 85 and the floor 76 extends into a sloped floor 86 which joins the divergent sidewalls 85 and a base 81. The base 81 is connected with the rib 77 and carries a rectangular projection 82, which has a cylindrical body 83 extending therefrom, along a line parallel to the floor 76. The cylindrical body 83 is terminated with a frustum 83a and is of such dimension to free fit into any of the holes 61. The rear fastening formation at 90 includes a base 91 which is a widened extension of the first edge wall 72 and the groove 74. The base 91 defines a land 97 from which a cylindrical formation 93 extends substantially normal to the land 97 and is bisected by a groove 93b. The cylindrical formation 93 is terminated with an interference fitting formation 93a for resilient forced engagement with any of the holes 61. When the circuit board slide is in assembly in the equipment shelf, the groove 74 is intended to receive an edge of one of the circuit boards, via the receiving end 84. Furthermore, the end portions 80 and 90 are conveniently broad to provide for structural robustness while the majority of the body portion of the circuit board slide along the groove 74 is comparatively narrower to provide greater free space between the card slides 70 as shown in FIG. 3, with the intent of reducing resistance to a flow of a cooling medium.

Figure 4A:
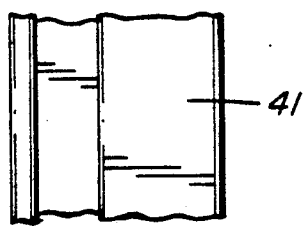
FIGS. 4a and 4c are inner edge and inner side fragmentary views and FIG. 4b is an end view, illustrating a front cross connecting member used in the equipment shelf in FIG. 3.
Figure 4B:
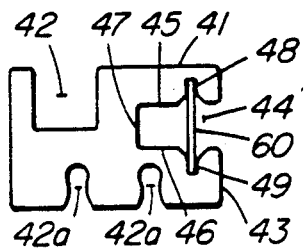
Figure 4C:
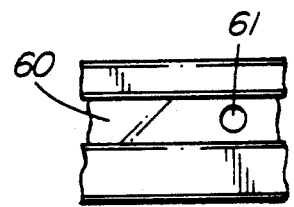
Figure 5C:
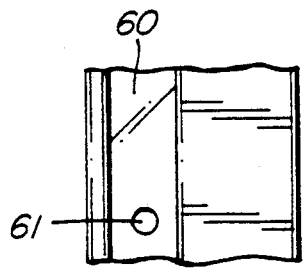
FIGS. 5a and 5c are outer edge and inner side fragmentary views and FIG. 5b is an end view, illustrating a rear cross connecting member used in the equipment shelf in FIG. 3.
Figure 5B:
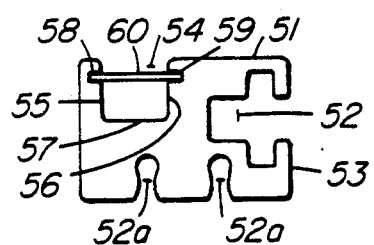
Figure 6:
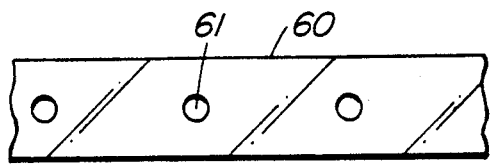
FIG. 6 is a partial plan view of a fastening element being insertable in the cross connecting members illustrated in FIGS. 4a, 4b and 4c, and in FIGS. 5a, 5b and 5c for defining lateral spacing of circuit board positions as illustrated in FIG. 2.

Referring to the FIGS. 4a–4c the front cross connecting member is in the form of an aluminum extrusion having a body portion cut to predetermined length corresponding to the distance between the side panels 8 and 9. A longitudinal channel 42 extends along an inner side 41 of the body portion and a longitudinal channel 44 extends along an inner edge 43 of the body portion. The longitudinal channel 42 is provided for cooperative engagement with a typical circuit board latching lever, not shown. The longitudinal channel 44 is defined by a pair of side surfaces 45 and 46 being connected by a bottom surface 47. The side surface 45 includes a flared groove 48 therein and the side surface 46 includes a similar flared groove 49 therein. Each of the grooves 48 and 49 is spaced a predetermined distance from the bottom surface 47 for slidably receiving a longitudinal edge of a circuit board slide fastening strip 60, which is illustrated in FIG. 6. The front cross connecting member includes a pair of grooves 42a for convenience of fastening with either of the side panels 8 and 9, by means of screw fasteners illustrated at 27 in FIG. 3.

Figure 5A:
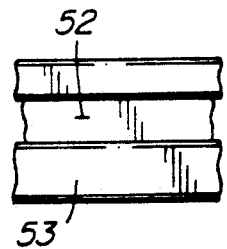

Referring to the FIGS. 5a–5c the rear cross connecting member is in the form of an aluminum extrusion having a body portion cut to predetermined length corresponding to the distance between the side panels 8 and 9. A longitudinal channel 52 extends along an outer edge 53 of the body portion and a longitudinal channel 54 extends along an inner edge 51 of the body portion. The longitudinal channel 52 is provided for cooperative engagement with a typical nut and bolt mounting of a back plane circuit board, not shown. The longitudinal channel 54 is defined by a pair of side surfaces 55 and 56 being connected by a bottom surface 57. The side surface 55 includes a groove 58 therein and the side surface 56 includes a similar groove 59 therein. The grooves 58 and 59 are spaced a predetermined distance from the bottom surface 57 for slidably receiving a longitudinal edge of a circuit board slide fastening strip 60, which is illustrated in FIG. 6. The rear cross connecting member includes a pair of grooves 52a for convenience of fastening with either of the side panels 8 and 9, by means of screw fasteners illustrated at 26 in FIG. 3.

Figure 7A:
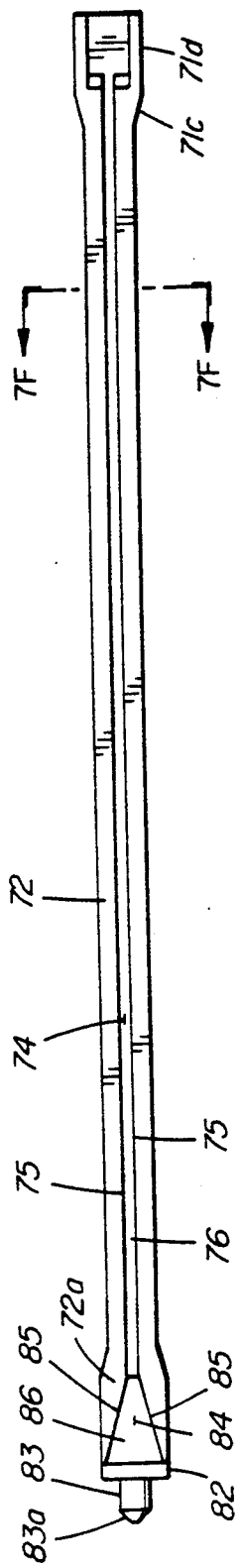
FIGS. 7a through 7f are views of a circuit board slide, for use in the equipment shelf illustrated in FIG. 3, in accordance with the invention.
Figure 7B:
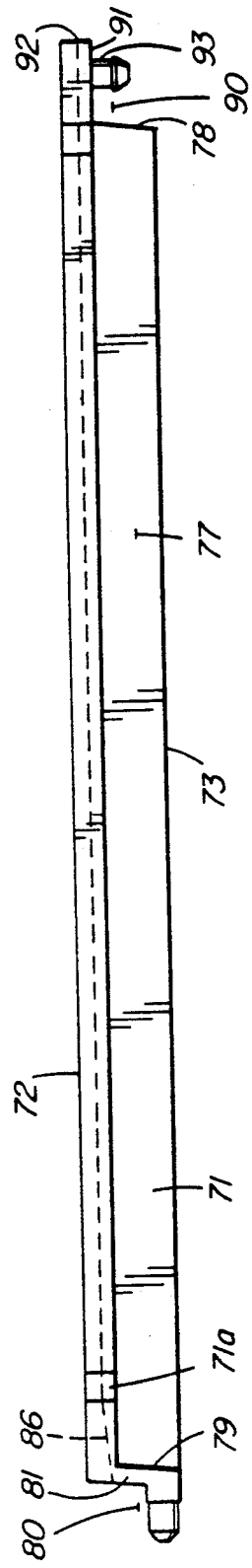
Figure 7C:
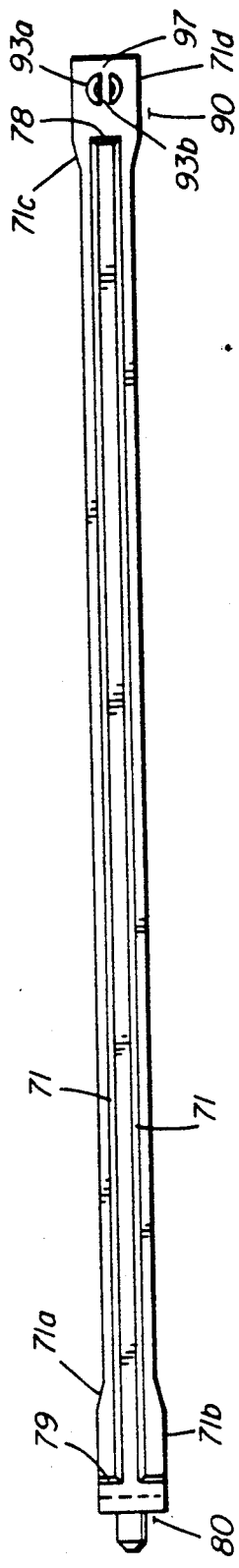
Figure 7D:
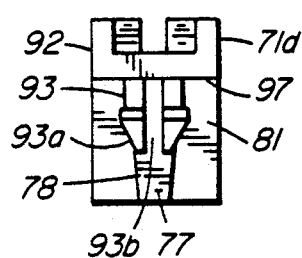
Figure 7E:
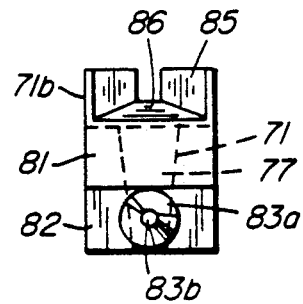
Figure 7F:
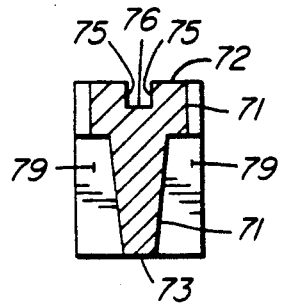
Figure 8:
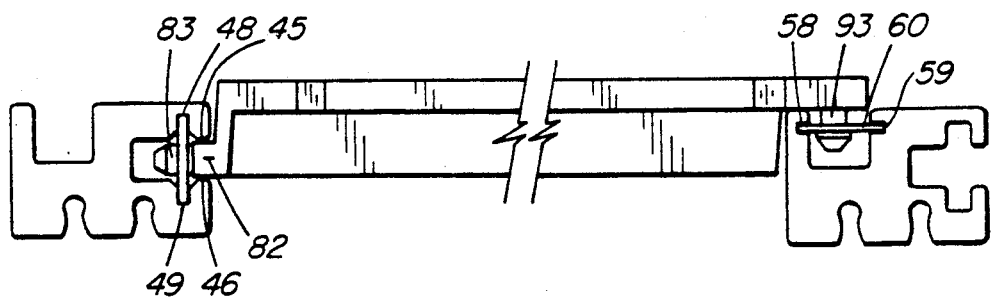
FIG. 8 is an illustration of a circuit board slide, similar to the circuit board slide in FIG. 7a being assembled with the front and rear cross connecting members in FIGS. 4b and 5b.

Referring to FIG. 8, the card slide substantially as illustrated in FIG. 7b is shown in assembly, on the left, with a front cross connecting member as illustrated in FIG. 4b, and on the right, with a rear cross connecting member as illustrated in FIG. 5b. This is facilitated by the strips 60 from FIG. 6 residing in the respective grooves 48, 49 and 58, 59, with circular openings 61 being occupied by the respective cylindrical bodies 83 and 93. The combination of the cylindrical body 93 and the strip 60 being of a polycarbonate material provides sufficient resilience that the body 93 remains substantially unabraded after several insertions into and removals from the circular hole 61. Furthermore substantial tolerance of variation of length of the card slides is permitted by another structural feature, that being the combination of the rectangular projection 82 residing between the walls 45 and 46. This structure accrues two advantages. One advantage is that the holes 61 may be circular and thus less expensively formed than oblong holes usually used for this purpose. The other advantage is that the card slider is restrained from rotation about its length, without stressing the fastening strips 60.

I claim:

1. An equipment shelf, for removable retaining circuit boards in a system, the equipment shelf comprising:

an assembly including, first and second end panels each having upper and lower front corners and upper and lower rear corners, the first and second end panels being spaced apart by a pair of front cross connecting members, fixed between respective ones of the upper and lower front corners, and by a pair of rear cross connecting members, fixed between respective ones of the upper and lower rear corners, and board slides being carried between upper ones of the front and rear cross connecting members and between lower ones of the front and rear cross connecting members;

each of the front and rear cross connecting members being an elongated body terminated at end portions and having a cross section bounded by interior and exterior edges connected by interior and exterior sides, each of the front cross connecting members including fastening means for releasably retaining a plurality of the board slides, said fastening means being associated with one of the interior edge and the interior side of a front cross connecting member, and each of the rear cross connecting members including fastening means for releasably retaining a plurality of the board slides, said fastening means being associated with one of the interior side and the interior edge of a rear cross connecting member, whereby each of the plurality of board slides is retainable between the side of one and the edge of another of the front and rear cross connecting members.

2. An equipment shelf as defined in claim 1 wherein each of the fastening means comprises:

a fastening element being removably fixed in each of the front and rear cross connecting members, each fastening element including a plurality of fastening locations being arranged in a predetermined pattern.

3. An equipment shelf as defined in claim 2 wherein each of the front and rear cross connecting members includes a retaining means for retaining one of the fastening elements, each of the fastening elements comprising:

an elongated flat strip having fastening locations being defined therein spaced apart one from another;

in each rear cross connecting member, the retaining means comprising:

a channel extending between the end portions, along the interior side of the body of the rear cross connecting member, and being defined by a pair of side surfaces being connected by a bottom surface, each of the pair of side surfaces having a groove therein being spaced a predetermined distance from the bottom surface, for slidably receiving one elongated flat strip; and in each front cross connecting member, the retaining means comprising:

a channel extending between the end portions, along the interior edge of the body of the front cross connecting member, and being defined by a pair of side surfaces being connected by a third surface, each of the pair of side surfaces being connected by a third surface, for slidably receiving one elongated flat strip;

whereby said board slides fixed at the fastening locations determine lateral spacings between circuit board positions and the equipment shelf.

4. An equipment shelf as defined in claim 3 wherein each of the front cross connecting members includes an engagement means for co-acting with a circuit board latching mechanism for restraining a circuit board within the system, the engagement means comprising:

a channel extending between the end portions, along the interior side and adjacent the exterior edge of the body of the front cross connecting member.

5. An equipment shelf as defined in claim 3 wherein each of the rear cross connecting members includes an engagement means for co-acting with mounting means for mounting a back plane assembly adjacent the rear corners of the end panels, the engagement means comprising:

a groove extending between the end portions, along the exterior edge of the body of the rear cross connecting member.

6. An equipment shelf including board slides being arranged to support edges of circuit boards, whereby the circuit boards are removably retained in a system, the equipment shelf comprising:

first and second end panels being fixed in a spaced apart relationship by a pair of front cross connecting members and by a pair of rear cross connecting members, and each of the board slides being carried between an inner edge of a front cross connecting member and an inner side of a rear cross connecting member said front cross connecting member and said rear cross connecting member being of different cross-sections respectively.

7. A board slide for use in an equipment shelf wherein a plurality of the board slides provide support for edges of circuit boards, whereby the circuit boards are removably retained in a system, the board slide comprising:

an elongated body including a pair of side walls connected by first and second edge walls, the side and edge walls extending a length between first and second fastening formations;

a groove in the first edge wall, the groove being defined by parallel sidewalls connected by a floor, the groove being for receiving the edge of one of the circuit boards;

the first fastening formation including a projection extending substantially parallel with respect to a line along said floor;

the second fastening formation including a projection extending substantially normal with respect to said line.

8. A board slide as defined in claim 7 further including an entrance for directing a circuit board edge into the groove, the entrance comprising:

an extension of the floor of the groove, the extension of the floor being adjacent to and inclined toward the first fastening formation, and extensions of the sidewalls of the groove, the extensions of the sidewalls being divergent with respect to one another and being connected by the extension of the floor.

9. An equipment shelf, for removably retaining circuit boards in a system, the equipment shelf comprising:

first and second end panels having front and rear edges being fixed in a spaced apart relationship by a pair of front cross connecting members and by a pair of rear cross connecting members, respectively;

a plurality of board slides being carried between an inner edge of a front cross connecting member and an inner side of a rear cross connecting member, each of the board slides comprising:

an elongated body including a pair of side walls connected by first and second edge walls, the side and edge walls extending a length between first and second fastening formations, the first fastening formation being fixed to the inner edge, and the second fastening formation being fixed to the inner side;

a groove in the first edge wall and being defined by parallel sidewalls connected by a floor, the groove being for receiving the edge of one of the circuit boards;

the first fastening formation including a projection extending substantially parallel with respect to a line along said floor;

the second fastening formation including a projection extending substantially normal with respect to said line.

10. An equipment shelf as defined in claim 9 wherein each of the board slides further comprises:

an entrance for directing a circuit board edge into the groove, the entrance including:

an extension of the floor of the groove, the extension of the floor being adjacent to and inclined to meet the inner surface of the front cross connect member, and extensions of the sidewalls of the groove, the extensions of the sidewalls being divergent with respect to one another and being connected by the extension of the floor.

11. An equipment shelf as defined in claim 9 wherein each of the front cross connecting members comprises:

a fastening element being an elongated flat strip having fastening locations being defined therein spaced apart one from another;

a retaining means wherein the fastening element is releasably fixed, the retaining means being a retaining channel extending between the end portions, along the interior edge of the body, and the retaining channel being defined by a pair of side surfaces being connected by a third surface, each of the pair of side surfaces having a groove therein being spaced a first predetermined distance from the third surface, the elongated flat strip being retaining therein, the retaining channel including a pair of walls extending from the side surfaces toward one another and terminating at secondary side walls being spaced a predetermined distance apart one from another; and the first fastening formation includes a rectangular protrudence being of a dimension to fit between the secondary side walls to restrain the board slide from rotational movement.

* * * * *

UNITED STATES PATENT AND TRADEMARK OFFICE
CERTIFICATE OF CORRECTION

PATENT NO. : 5,033,627
DATED : 23 July 1991
INVENTOR(S) : David C. BROWN

It is certified that error appears in the above-identified patent and that said Letters Patent is hereby corrected as shown below:

In the Claims

Col. 7, lines 3 and 4     After "surfaces" delete "being connected by a" and insert therefor --having a groove therein being spaced a predetermined distance from the--.

Signed and Sealed this

Thirteenth Day of July, 1993

Attest:

MICHAEL K. KIRK

Attesting Officer     Acting Commissioner of Patents and Trademarks